(12) United States Patent
Wong

(10) Patent No.: US 6,809,420 B1
(45) Date of Patent: Oct. 26, 2004

(54) CHARACTERIZATION OF INDUCED SHIFT ON AN OVERLAY TARGET USING POST-ETCH ARTIFACT WAFERS

(75) Inventor: Alan Wong, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/514,967

(22) Filed: Feb. 29, 2000

(51) Int. Cl.[7] .............................................. H01L 23/48
(52) U.S. Cl. ...................... 257/773; 257/774; 257/775
(58) Field of Search ................................ 257/773, 774, 257/775, 776, 777; 430/30

(56) References Cited

U.S. PATENT DOCUMENTS

| | | | |
|---|---|---|---|
| 4,323,420 A | * | 4/1982 | Masnari et al. ............... 438/19 |
| 5,539,845 A | * | 7/1996 | van der Tol ................... 438/31 |
| 5,834,323 A | * | 11/1998 | Ghafghaichi et al. .......... 438/17 |
| 6,004,706 A | * | 12/1999 | Ausschnitt et al. ............ 430/30 |
| 6,048,588 A | * | 4/2000 | Engelsberg .......... 257/E21.295 |
| 6,188,138 B1 | * | 2/2001 | Bodo et al. .................. 257/778 |

* cited by examiner

*Primary Examiner*—Kevin M. Picardat
(74) *Attorney, Agent, or Firm*—Blakely, Sokoloff, Taylor & Zafman LLP

(57) ABSTRACT

The invention relates to an overlay that allows for the characterization of wafer-induced shift without the added risk of low wafer yield. The present invention also relates to a method of quanitifying both wafer-induced shift and tool-induced shift in the field of photolithgraphy. By chararacterizing wafer-induced shift in an artifact wafer, tool-induced shift may be determined by use of the characterized wafer.

14 Claims, 21 Drawing Sheets

TARGET A

TARGET B

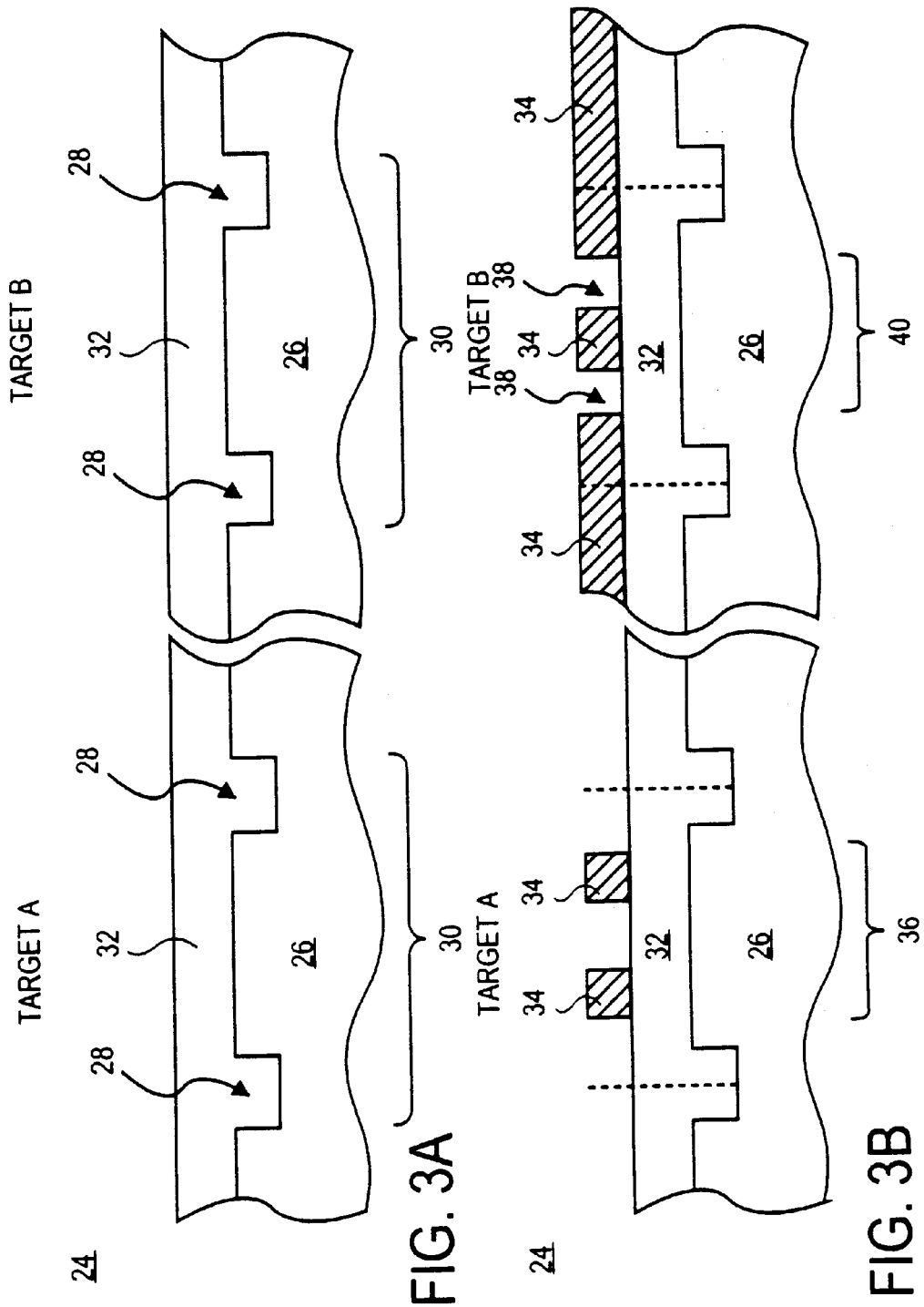

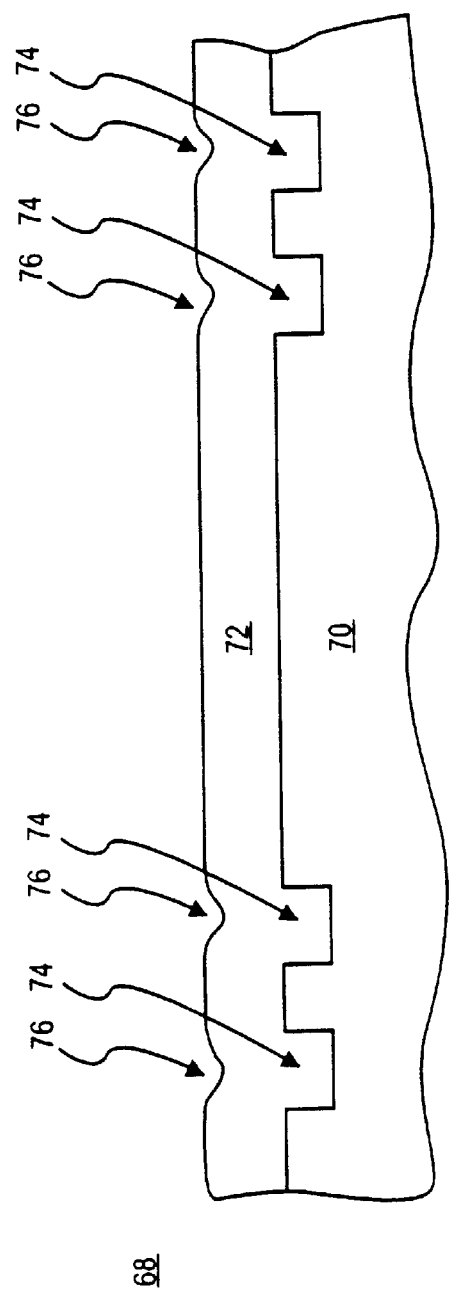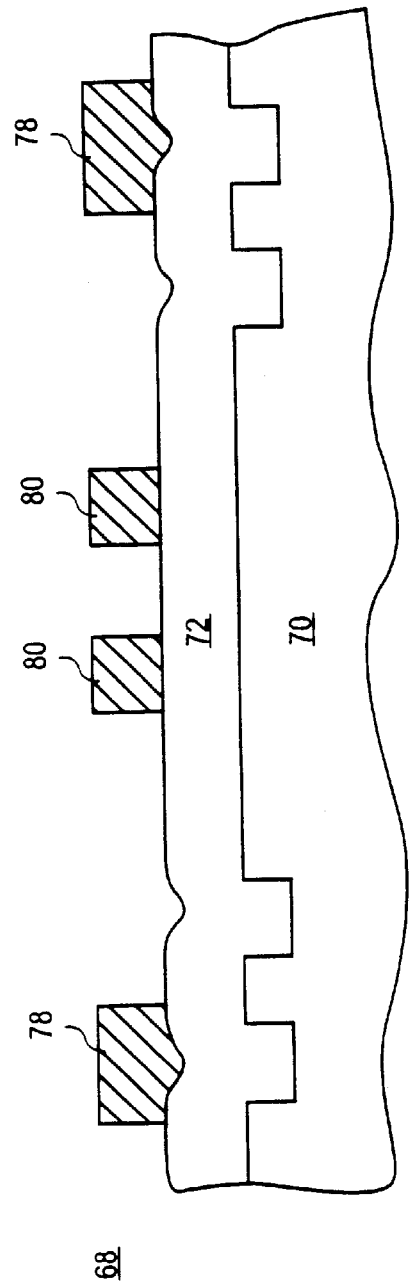
FIG. 7A
FIG. 7B

100

110

Provide a wafer, the wafer comprising:

a first overlay pattern disposed upon a substrate, and a second overlay pattern disposed upon a substrate, The second overlay pattern has a reversed polarity to the first overlay pattern

120

Measure differences on each of the first overlay pattern and the second overlay pattern

FIG. 12

CHARACTERIZATION OF INDUCED SHIFT ON AN OVERLAY TARGET USING POST-ETCH ARTIFACT WAFERS

BACKGROUND OF THE INVENTION

1. Field of the Invention

The present invention relates generally to integrated circuit fabrication, and, more specifically, the present invention relates to metrology in the field of photolithography. In particular, the present invention relates to a methodology that uses multiple overlay targets that characterizes wafer-induced shift and tool-induced shift.

2. Description of Related Art

Metrology errors have traditionally consumed a small portion of the overall overlay budget. Registration is a measure of overlay error. Since design rules in advanced lithography processes require tighter overlay performance, these overlay errors become more significant as feature dimensions shrink. In a 0.18 micrometer (micron) process, the overlay requirement is less than 70 nm. Assuming a 10% overlay budget for metrology error, the overlay requirement translates to less than 7 nm of overall measurement uncertainty. The overall measurement uncertainty includes the inherent uncertainty and the tool induced shift (TIS) of the metrology tool, the variability of the overlay target, and the error that results from the bias between post develop condition (DC) of the mask and the after etch condition (FC) measurements.

FIG. 1a illustrates a prior art method of minimizing overlay measurement error. In FIG. 1a, a semiconductor structure 10 comprises a substrate 12, and a recess created in a layer 14 such as an interlevel dielectric layer (ILD). Upon ILD layer 14 and substrate 12, an overcoating layer 16 such as a metallization film is formed. Upon overcoating layer 16 is patterned a mask 18 that is calculated to be substantially centered over the recess in ILD layer 14. Measurement of how well centered mask 18 is over the recess in ILD layer 14 comprises the difference between A1 and B1. If A1–B1 is acceptable, an etch is conducted that creates a feature 20 as illustrated in FIG. 1b. Subsequently, the measurement of how well-centered mask 18 was in the recess in ILD layer 14 can be done by calculating the difference between A2 and B2.

In a typical lithography process, an exposure tool will lay down mask 18 as the current layer pattern, that attempts to be aligned to substrate 12 with the pattern of the previous layer 14. The corresponding overlay structures are usually embedded under a thin film layer such as overcoating layer 16 to be patterned. After etching the pattern formed by mask 18 into overcoating layer 16 and stripping mask 18, these structures are usually exposed and are easy for overlay tools to image.

Measurement of error can then be carried out. However, this measurement would be after-the-fact of the etch. Consequently, a poor overlay on a wafer could therefore not be corrected after etch (FC). Often measurement in a post develop condition (DC) is more applicable in a device manufacturing environment. Any overlay error that results from an unacceptable alignment could be corrected by stripping away the resist and by laying down a new pattern with the proper corrections. But where a poor quality placement of resist 18 occurs within the recess created in ILD layer 14, it is too late to correct the error for the existing wafer because it is after etch (FC). In other words, where A2–B2 is significantly larger than zero, the wafer must be discarded.

FIG. 2a illustrates the structure of FIG. 1a in plan view. FIG. 2a illustrates that A1 is a measure between an edge of mask 18 and a feature near or at the outer box perimeter 22. Similarly, B1 is a measure between another edge of mask 18 and a feature near or at outer box perimeter 22. FIG. 2b illustrates the structure of FIG. 1b in plan view. FIG. 2b illustrates that A2 is a measure between an edge of feature 20 and the outer box perimeter 22. Similarly, B2 is a measure between another edge of feature 20 and outer box perimeter 22. As set forth herein, although the process of getting A2–B2 to be equal to zero can be achieved by several approximations and corrections, the cost of arriving at this process may be several wasted substrates due to the fact that the etch required to achieve the structure depicted in FIGS. 1b and 2b has resulted in an irreversible step. Where A2–B2 is unacceptable, wafer yield is lowered.

To achieve the most accurate DC overlay measurement, such as is illustrated in FIGS. 1a and 1b, overcoating layer 16 should be removed to expose the associated targets prior to laying down the resist pattern. However, this would require an extra etch operation which is unfavorable in terms of cost and time.

Measurements in DC are usually done while the overlay targets are still embedded. In certain cases, the thin film material is opaque and the overlay tool will image onto the topologies created by the profile of overcoating layer 16 on the top surface. For transparent films, images are formed through overcoating layer 16, although the index of refraction of such transparent materials may render a measurement accuracy that is no better than estimation required with opaque overcoating layers 16. In either case, the major source of measurement uncertainty comes from film material of overcoating layer 16. Variations of film thickness, surface profile or optical properties result in a change in imaging condition of the overlay targets.

What is needed is a method that overcomes the problems in the prior art.

BRIEF DESCRIPTION OF THE DRAWINGS

FIG. 2a is a plan view of the structure depicted in FIG. 1a;

FIG. 3a is an elevational cross-section view of a semiconductor structure that may typify bars-in-bars registration structure;

FIG. 3b is an elevational cross-section view of the semiconductor structure depicted in FIG. 3a after further processing;

FIG. 4a is a plan view of the structure depicted in FIG. 3a;

FIG. 6a is a plan view of the structure depicted in FIG. 5a;

FIG. 7a is an elevational cross section view of a semiconductor structure;

FIG. 7b is an elevational cross-section view of the semiconductor structure depicted in FIG. 7a after further processing;

FIG. 8a is a plan view of the structure depicted in FIG. 7a;

FIG. 12 is a flow chart that describes an inventive method according to the present invention.

DETAILED DESCRIPTION OF THE INVENTION

Figure 1A:
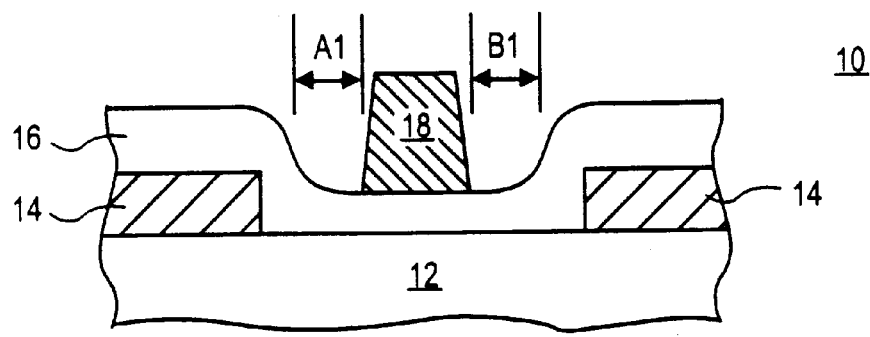
FIG. 1a is an elevational cross-section view of a semiconductor structure that may typify a box-in-box registration structure.
Figure 1B:
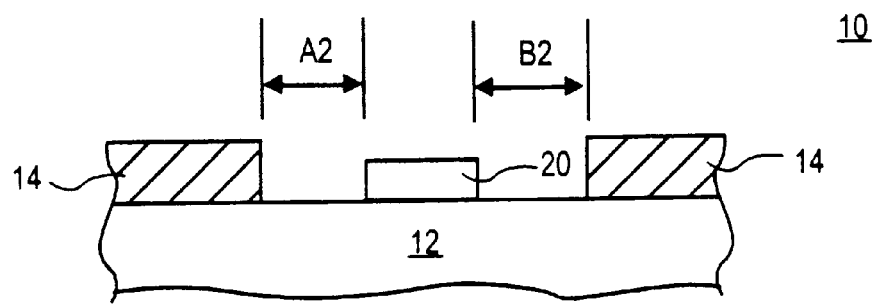
FIG. 1b is an elevational cross-section view of the semiconductor structure depicted in FIG. 1a after further processing.
Figure 2A:
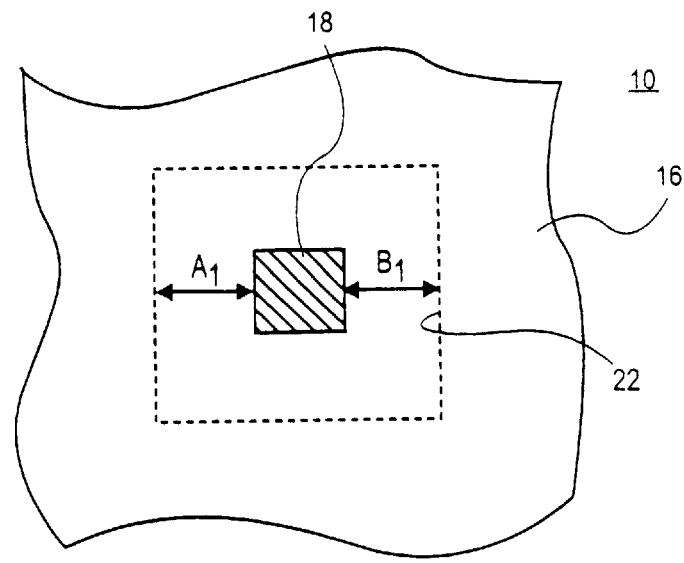
Figure 2B:
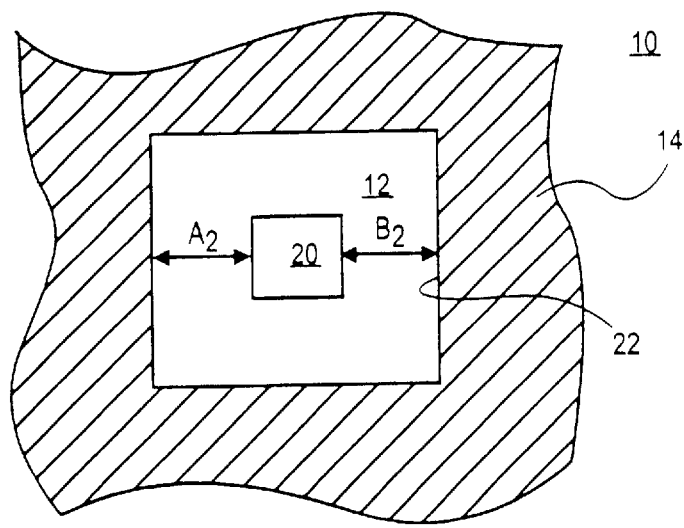
FIG. 2b is a plan view of the structure depicted in FIG. 1b.

The present invention makes use of two overlay target designs on a single wafer that complement each other in after etch conditions. A first target has a post develop condition (DC) configuration that is resembled by a second target after etch (FC). Because the first target after the etch provides a more accurate overlay measurement than the second target, the present invention measures the first target DC to obtain a reliable prediction of the measurement of the first target after etch.

TIS is a widely accepted metric for overlay tool accuracy. It can be calculated by collecting overlay results at both 0 and 180 degree orientations. Equipment manufacturers have been spending much effort in improving optical alignment in overlay systems to reduce TIS, in order to meet the Semiconductor Industry Association (SIA) roadmap specifications. However, reducing TIS alone may be insufficient to achieve such specifications. Another major error contribution, wafer-induced shift (WIS) has not been sufficiently addressed, mostly because such error is often process specific and is correlated with the intrinsic process variability. WIS is usually difficult to quantify or inaccessible for equipment manufacturers to qualify their overlay systems.

Success in chemical mechanical polishing (CMP) processes such as for tungsten, interlayer dielectric and shallow trench isolation (STI) has made overlay measurement a new challenge as these CMP processes tend to destroy the overlay targets and alignment marks alike. Difficulties in stepper and scanner alignment are accompanied by similar measurement difficulties, while accurate overlay metrology is most needed.

Some methodologies have been proposed for minimizing overlay measurement error through various target designs. Through the evaluation of different designs of overlay targets, an optimum design can be found for the particular process condition. However, this procedure needs to be repeated each time that the process condition has changed.

The following description includes terms, such as upper, lower, first, second, etc. that are used for descriptive purposes only and are not to be construed as limiting. The embodiments of an apparatus or article of the present invention described herein can be manufactured, used, or shipped in a number of positions and orientations.

Reference will now be made to the drawings wherein like structures will be provided with like reference designations. In order to show the structures of the present invention most clearly, the drawings included herein are diagrammatic representations of integrated circuit structures. Thus, the actual appearance of the fabricated structures, for example in a photomicrograph, may appear different while still incorporating the essential structures of the present invention. Moreover, the drawings show only the structures necessary to understand the present invention. Additional structures known in the art have not been included to maintain the clarity of the drawings.

As the FC overlay measurement is a more accurate representation of the true alignment performance, the present invention relates to matching the DC measurement with the FC overlay measurement. The difference between DC and FC measurement is defined as a metric for wafer induced shift (WIS). However, WIS can only be collected by making a measurement in DC, putting the wafer through etch, then making another measurement in FC. To optimize the DC measurement until it matches FC, this procedure is repeated multiple times to achieve a minimized WIS.

In a manufacturing environment, logistics problems can make WIS data collection very difficult. The present invention makes DC and FC overlay measurements available simultaneously. Consequently, the process of WIS data collection is made much simpler.

There are a few differences between DC measurements and FC measurements. DC has resist features as inner target and embedded outer target while FC has etched film features as inner target and exposed outer target. The most significant source of measurement difference is usually the image of the outer target due to the embedded and exposed conditions. As it was previously impossible to obtain both measurements on the same overlay target simultaneously, the present invention simulates the measurement condition using a complementary target design with an embedded outer target in FC.

By providing both exposed and embedded outer targets on the same wafer, the present invention provides a tool for evaluating measurement algorithms and the optical system of overlay tools. Although several film layer materials may be used, the present invention used polysilicon layers on STI as an example. Polysilicon is a transparent material with high refractive index. In certain illumination conditions, the overlay equipment was able to image the embedded outer target in the STI layer through the polysilicon film. The DC overlay measurements are often noisy and hence inaccurate. With the help of an artifact wafer, the present invention improved the accuracy of the DC overlay measurement and identified problematic overlay tools.

To address the WIS contribution to the overlay error, various types of inventive overlay targets are implemented in the inactive area of a wafer, such as metrology cells in the scribe line. In one embodiment, two targets are provided on the same wafer. FIG. 3a illustrates the preparation of a two-target overlay wafer according to the present invention. The two targets are preferably located next to each other. The inventive overlay 24 is fabricated by providing a previous layer 26 that includes recesses 28 therein. Recesses 28 comprise an outer target 30. Optionally, previous layer 26 may be planarized such as by chemical-mechanical polishing (CMP). A film such as an overcoating layer 32 may be formed upon previous layer 26. Overcoating layer 32 may be a polysilicon or metallization layer. Optionally, overcoating layer 32 may be planarized such as by chemical-mechanical polishing (CMP). FIG. 3a shows an elevational side view of the resulted structure after polysilicon deposition and related CMP processes.

After optional CMP, prominences 34 form an inner target 36 such as by a mask upon the larger area referred to herein as Target A. Upon the complementary portion of overlay 24, referred to herein as Target B, recesses 38 form an inner target 40 that preferably has the same dimensions as inner target 36. With mask 34 in place, overlay 24 is etched to form overlay 24 depicted in FIG. 3c.

Figure 3C:
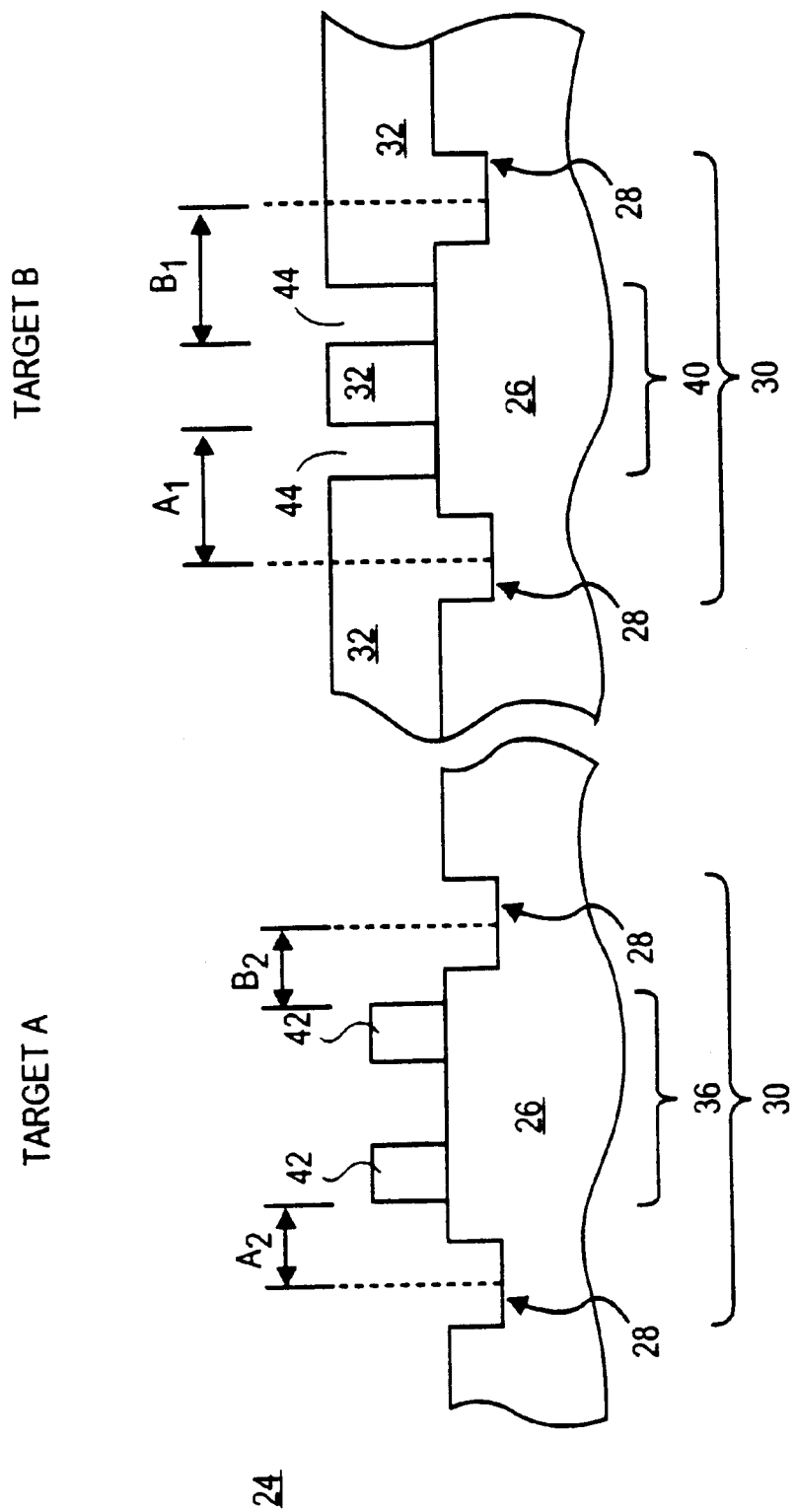
FIG. 3c is an elevational cross-section view of the semiconductor structure depicted in FIG. 3b after further processing.

In FIG. 3c, overlay 24 comprises a first overlay pattern (Target A) disposed upon a substrate such as previous layer 26. The first overlay pattern comprises recesses 28 as outer target 30 and film prominences 42 as inner target 36. As such, a measurement of A2–B2 may be taken directly. A second overlay pattern (Target B) is disposed upon previous layer 26, wherein the second overlay pattern has a complementary polarity to the first overlay pattern. The second overlay pattern comprises prominent portions of film layer 32 that form film recesses 44. As such, a measurement of A1–B1 may be estimated if film layer 32 is at least partly transparent or if evidence remains of the location of recesses 28.

Figure 4A:
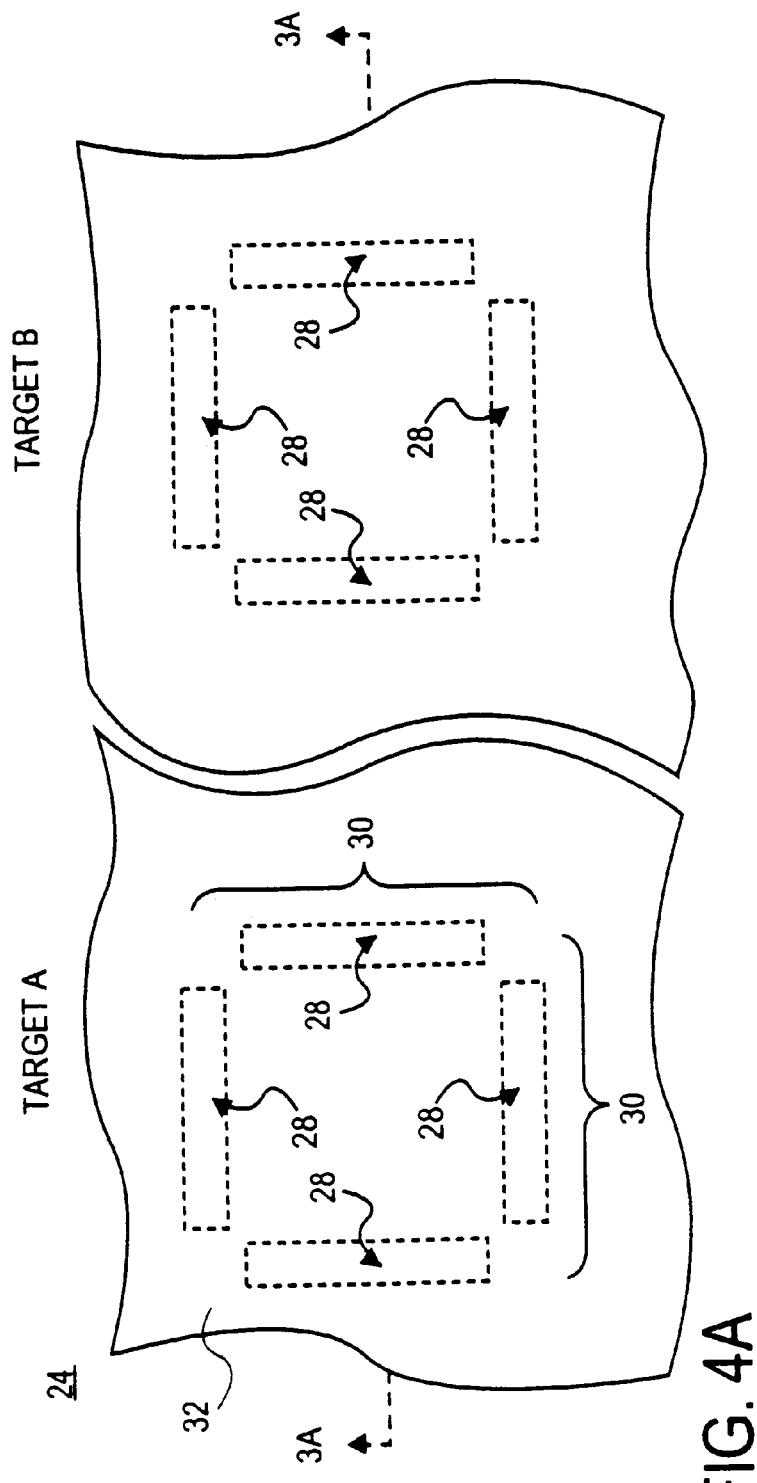

FIG. 4a is a plan view of the structure depicted in FIG. 3a. Fabrication of overlay 24 is illustrated wherein the outer target 30 comprises previous layer recesses 28 as illustrated in phantom lines due to their cover by overcoating layer 32.

Figure 4B:
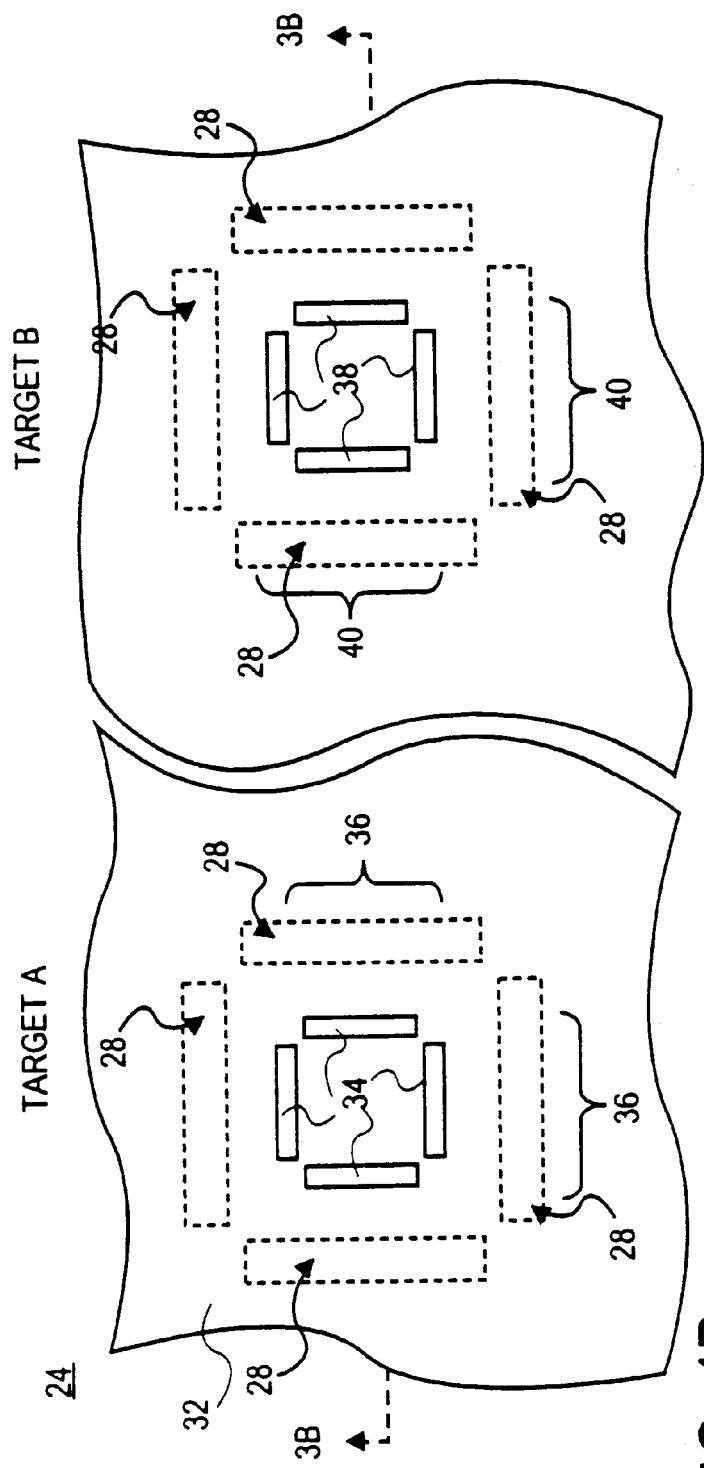
FIG. 4b is a plan view of the structure depicted in FIG. 3b.

In FIG. 4b the formation of mask prominences 34 at Target A is complemented by the formation of mask recesses 38 at Target B. An inner target 36 comprises the dimensions of mask prominences 34. Likewise, an inner target 40 comprises the dimensions of mask recesses 38. The overlay may include the structure depicted in FIG. 4b, wherein a first overlay pattern comprises prominent inner bars 34 and embedded outer bars 28. The overlay may also include the structure depicted in FIG. 4b wherein the overlay pattern comprises recessed inner bars 38 and embedded outer bars 28.

Figure 4C:
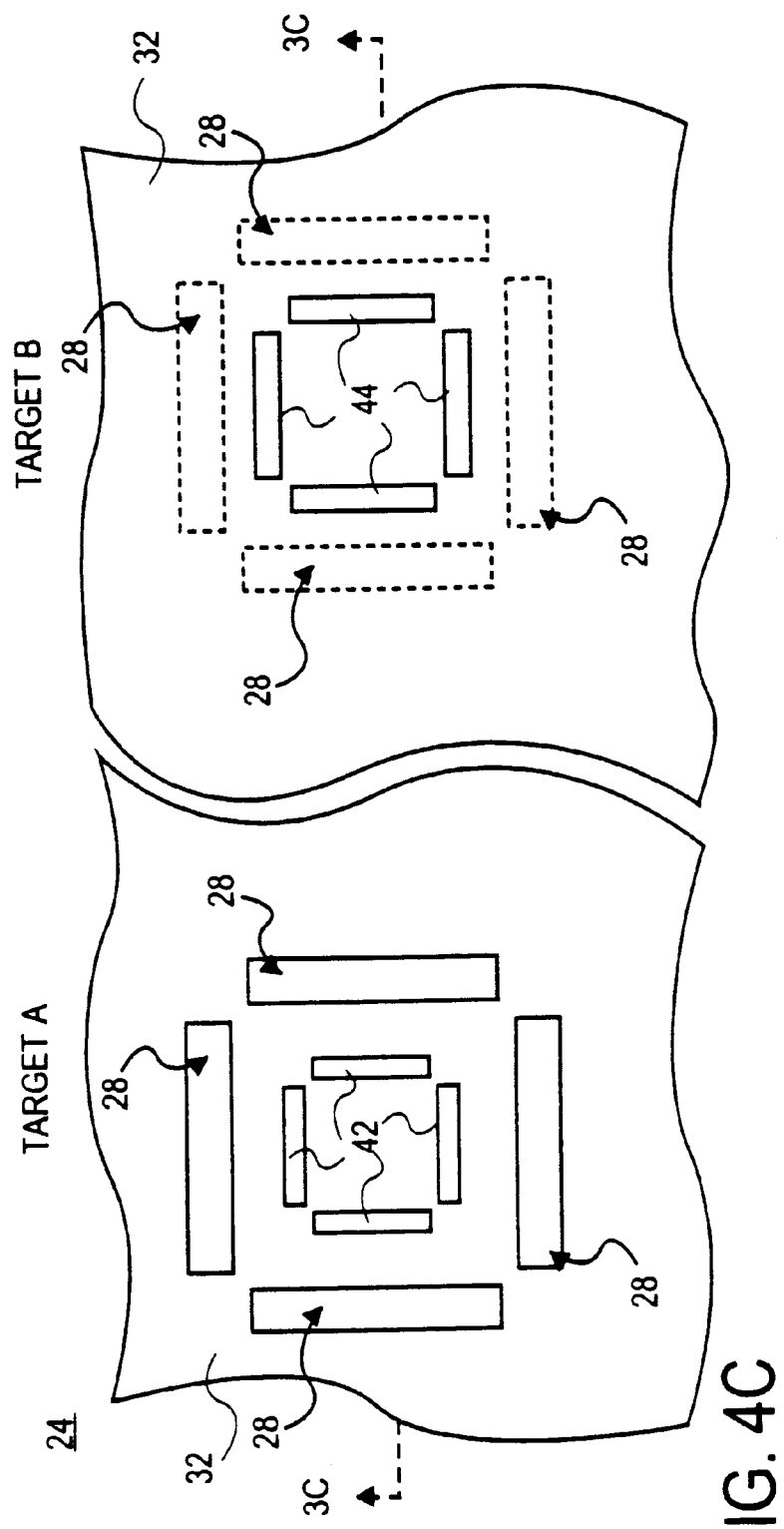
FIG. 4c is a plan view of the structure depicted in FIG. 3c.

The overlay may also be viewed in a more finished state according to the depiction in FIG. 4c. The overlay pattern may comprise prominent inner bars 42 and recessed outer bars 28 at Target A. In the complementary overlay pattern at Target B, the overlay pattern may comprise recessed inner bars 44 and embedded outer bars 28. In both overlay types, the outer targets are etched into the previous layer 26, such as an STI, in the same manner.

After a series of CMP and deposition processes, the outer target is now embedded in the overcoating layer 32. In this example, polysilicon is the preferred overcoating material comprising film layer 32. The inner target of the current layer, i.e. polysilicon, is then patterned with resist through a spin/expose/develop process. The first type that includes inner target 36 uses a positive polarity with resist bars atop the previous layer structure; the second type that includes inner target 40 uses a negative polarity with resist voids atop. These DC structures are illustrated in FIG. 3b.

The wafer will then proceed to the etch process as set forth above. After removing the resist, the two targets in FC resemble a cross section as set for the in FIG. 3c.

In the overlay target with a positive polarity, the FC structure in FIG. 3c has an exposed outer target that allows for direct measurement of A2–B2 at Target A. It provides the easiest structure to be measured optically as the overlay tool could image directly onto the target. In the case of negative polarity, the overlay target with negative polarity has the outer target embedded under the overcoating layer 32. To obtain an overlay measurement, the overlay tool will image the outer target in Target B of FIG. 3c through the polysilicon comprising film layer 32. This imaging will resemble the outer target 30 of the overlay portion at Target A in DC.

The present invention may have at least two types of overlay targets across the whole wafer. One type has the outer overlay target exposed and the other type has the outer target embedded under the overcoating material of film layer 32. According to the present invention, overlay is measured from both of these targets. As these targets may be located next to each other on the wafer, the actual overlay difference is minimal. Any measurement difference can be contributed to the difference between imaging of the two targets. This should include the structure of the targets and its interaction with the optical system, in addition to the inherent uncertainty of the overlay tool.

In the present invention a new overlay target was inserted into a production wafer with a reverse polarity with respect to the original overlay target. Consequently, any production wafer in the post etch stage may be used as an artifact wafer in order to practice the present invention.

Figure 5A:
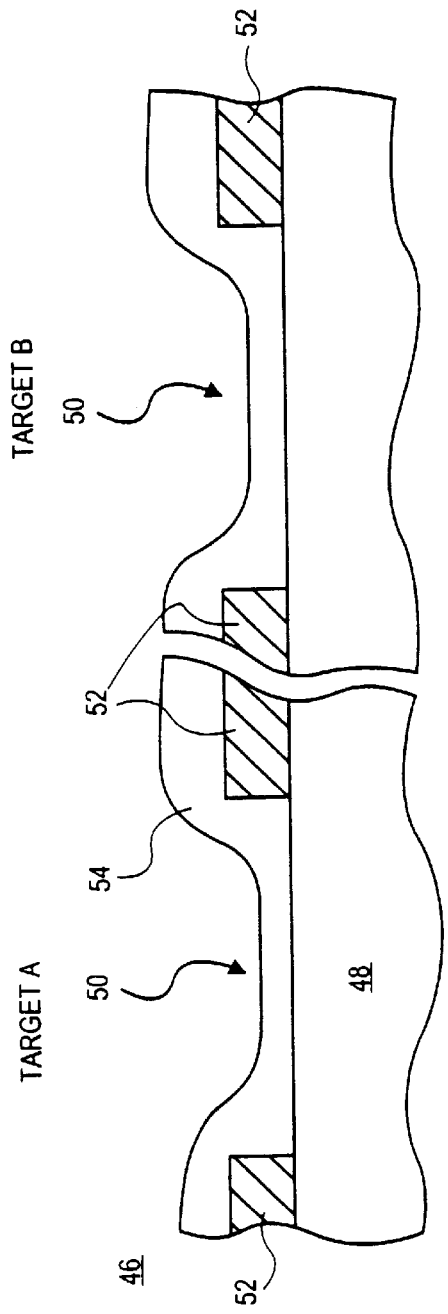
FIG. 5a is an elevational cross-section view of a semiconductor structure that may typify a box-in-box registration structure.

Other target schemes were developed according to the present invention. FIG. 5a illustrates a box-in-box overlay 46 during fabrication. In FIG. 5a, overlay 46 comprises a previous layer 48 such as a substrate, and a recess 50 created in a layer 52 such as an ILD layer 52. Upon previous layer 48 and ILD layer 52, an overcoating layer 54 such as a metallization film is formed.

Figure 5B:
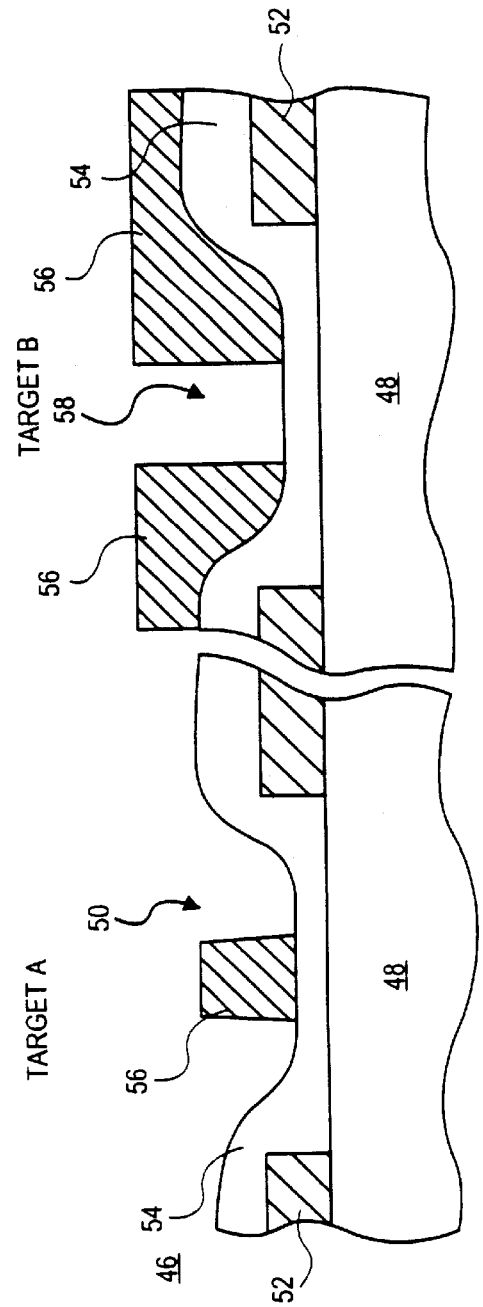
FIG. 5b is an elevational cross-section view of the semiconductor structure depicted in FIG. 5a after further processing.
Figure 5C:
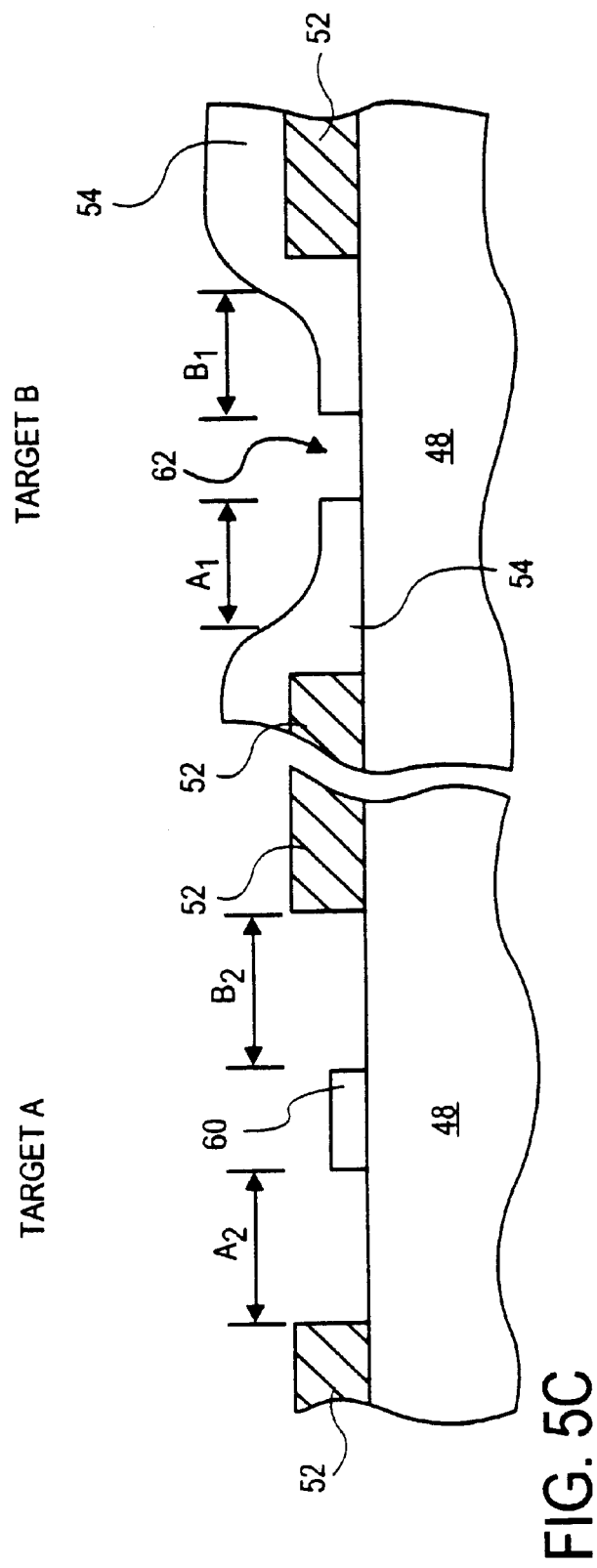
FIG. 5c is an elevational cross-section view of the semiconductor structure depicted in FIG. 5b after further processing.

Upon Target A, overcoating layer 54 is patterned with a mask 56 that is calculated to be substantially centered over recess 50. Upon Target B, mask 56 is patterned to be the structural opposite of that upon Target A. In other words, a mask recess 58 forms a box-in-box configuration in Target B wherein the outer target is embedded beneath overcoating layer 54. The DC structure is depicted in FIG. 5b. The FC structure is depicted in FIG. 5c. It can be seen from FIG. 5c that the measurement A2–B2 can be taken directly, whereas the measurement A1–B1 must be estimated based upon an embedded feature.

Figure 6A:
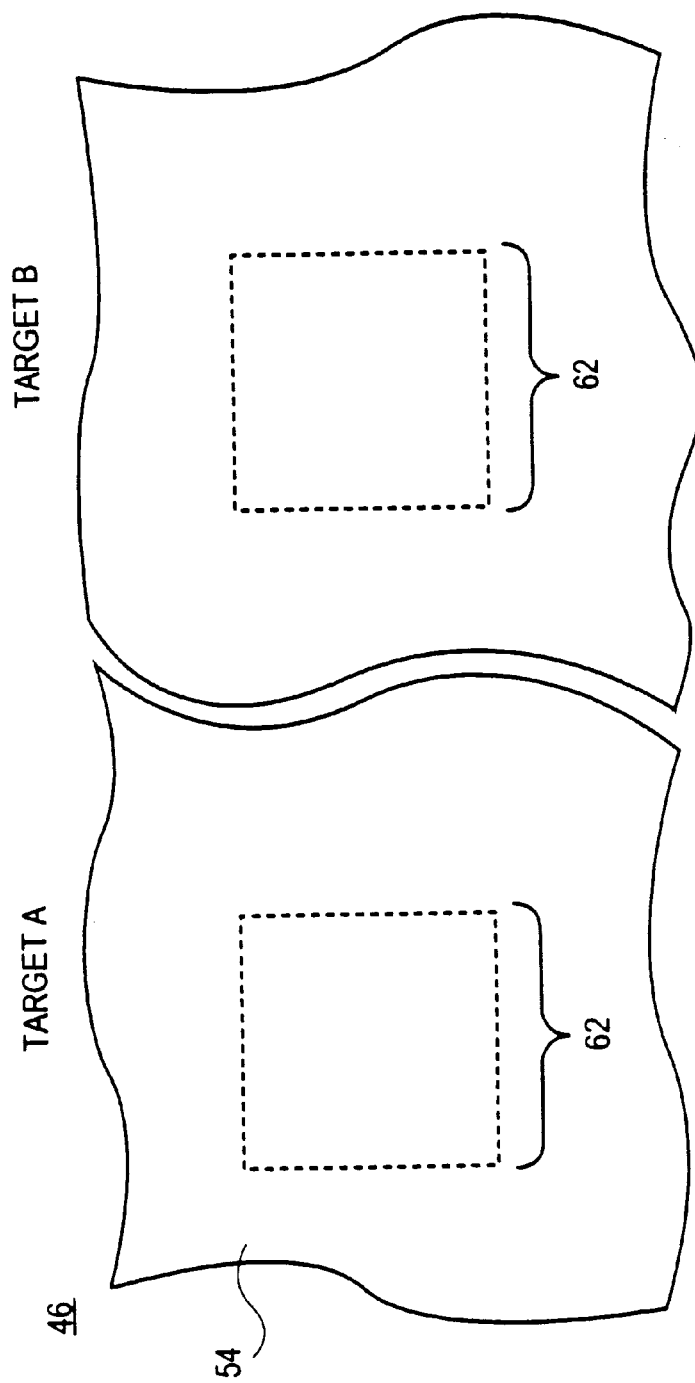
Figure 6B:
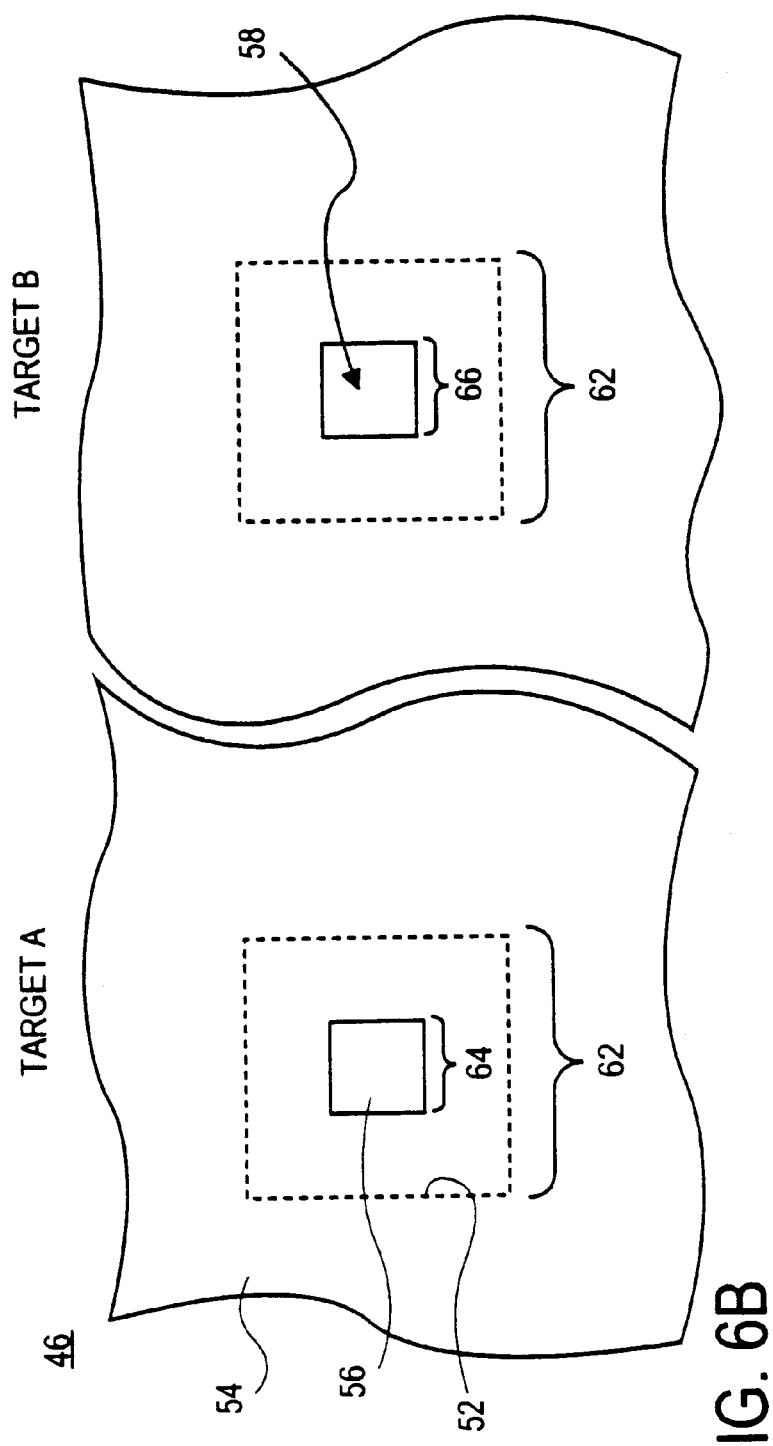
FIG. 6b is a plan view of the structure depicted in FIG. 5b.

FIG. 6a is a plan view of the structure depicted in FIG. 5a. Fabrication of overlay 46 is illustrated wherein the outer target 62 is defined by ILD layer 52. In FIG. 6b the formation of mask prominence 56 is complemented in Target B by the formation of a mask recess 58. An inner target 64 comprises the dimensions of mask prominence 56. Likewise, an inner target 66 comprises the dimensions of mask recess 58. Overlay 46 as depicted in FIGS. 5b and 6b for Target A may be referred to as a first overlay pattern comprising a prominent inner rectangle 56 and an embedded outer rectangle 52. Overlay 46 as depicted in FIGS. 5b and 6b for Target B may be referred to as a second overlay pattern comprising a recessed inner rectangle 58 and an embedded outer rectangle 52.

Figure 6C:
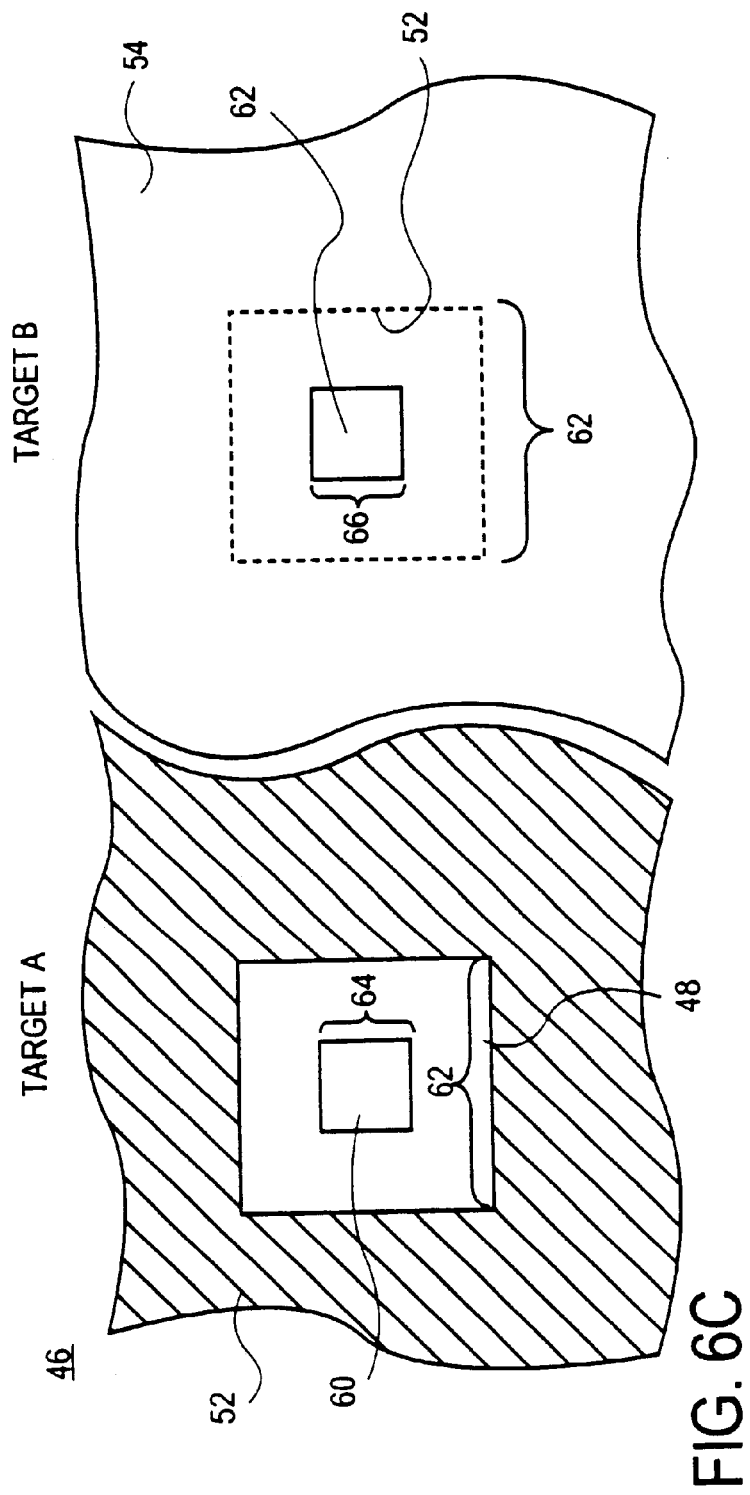
FIG. 6c is a plan view of the structure depicted in FIG. 5c.

The overlay may also be viewed in a more finished state according to the depiction in FIG. 6c. The FC overlay pattern depicted for Target A may comprise a prominent inner rectangle 60 and a recessed outer rectangle 52. The FC overlay pattern depicted for Target B may comprise a recessed inner rectangle 62 and an embedded outer rectangle 52.

In both overlay types, the outer targets are etched into the previous layer 46, such as a shallow trench isolation (STI), in the same manner. After a series of CMP and deposition processes, the outer target is now embedded in the overcoating material such as overcoating layer 54. In this example, polysilicon is the overcoating material comprising overcoating layer 54.

The inner target of the current layer, i.e. polysilicon, is then patterned with resist through a spin/expose/develop process. The first type that includes inner target 64 uses a positive polarity with resist atop the previous layer structure; the second type that includes inner target 66 uses a negative polarity with a resist void atop. These DC structures are illustrated in FIG. 5b.

Another embodiment of the present invention is depicted in FIG. 7a. In this embodiment, both target types are contained in a single target. By this embodiment, it is possible to make fewer measurement scans across a wafer surface. In FIG. 7a, an overlay 68 begins to take shape with a previous layer 70 that has been patterned with a plurality of recesses 74. Additionally, an overcoating layer 72 has been disposed upon previous layer 70.

FIG. 7b illustrates further processing of overlay 68 by the patterning of a mask that includes a mask first or outer pattern 78 and a mask second or inner pattern 80. In other words, overlay 68 comprises first overlay pattern 78 disposed upon a substrate such as overcoating layer 72. Overlay 68 also comprises second overlay pattern 80 disposed upon the substrate such as overcoating layer 72. It is observed that first overlay pattern 78 is disposed over an embedded feature in the substrate; first overlay pattern 78 is disposed over recess 74. Further, second overlay pattern 80 is disposed symmetrically to the first overlay pattern 78 but not over an embedded feature. The structure depicted in FIG. 7b illustrates processing DC.

Figure 7C:
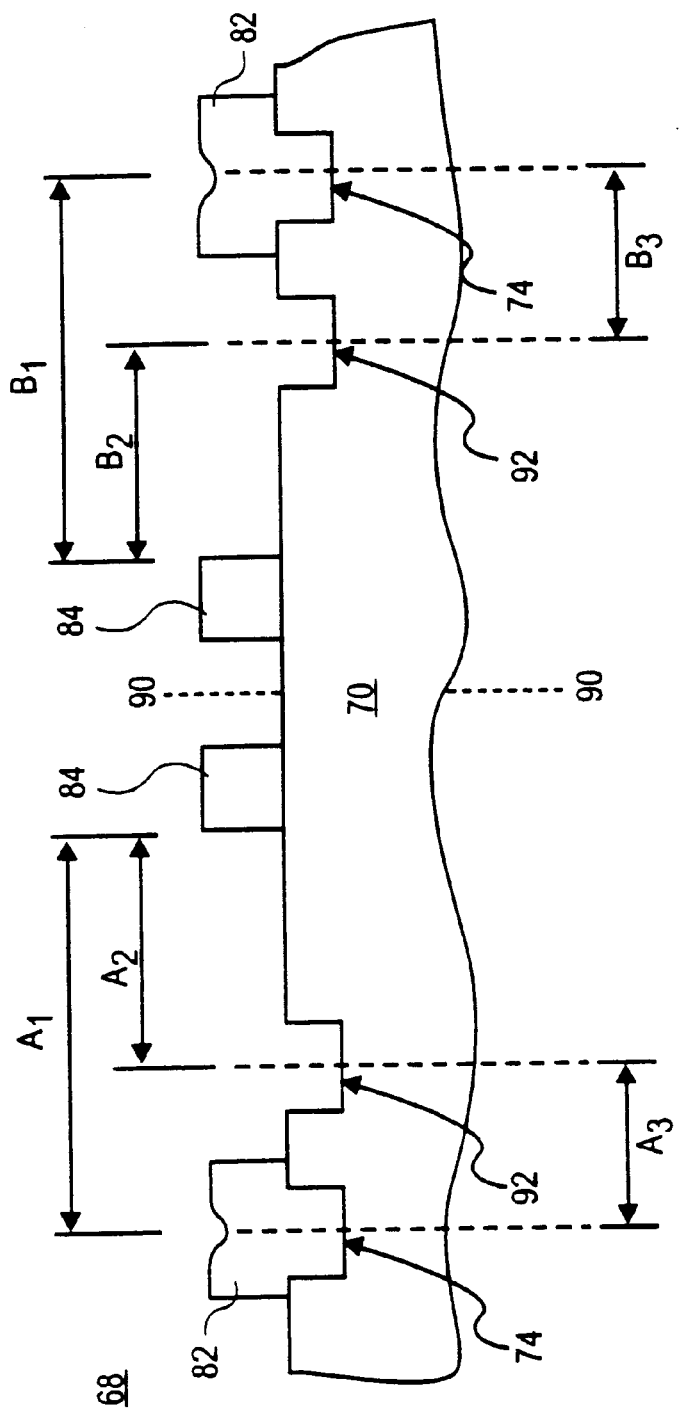
FIG. 7c is an elevational cross-section view of the semiconductor structure depicted in FIG. 7b after further processing.

According to the present invention, further processing of overlay 68 is illustrated in FIG. 7c. An FC structure reveals two target types in the same field. Overlay 68 includes a first overlay pattern that comprises a patterned overcoating layer 82. As such, patterned overcoating layer 82 obscures an embedded feature such as recess 74. Patterned overcoating layer 82 makes an outer target. A patterned surface layer 84 is formed by mask inner pattern 80 depicted in FIG. 7b.

Overlay 68 has the qualities of both direct measurement and estimation measurement within the same visual field such that reference to two overlays is not necessary. Consequently, measurement of A1–B1 and A2–B2 may be taken simultaneously from a single visual field. A direct measurement of the difference A3–B3 can be obtained.

According to the present invention, a method of characterizing a device such as a wafer or a tool is provided. The method comprises providing an overcoating layer 72 over an embedded feature 74 such in a substrate 70. A patterned surface is provided upon the substrate, wherein the first overlay pattern 78 and the patterned surface layer 80 have at least a bilateral symmetry relationship. In other words, a symmetry line 90 establishes at least bilateral symmetry for overlay 68. The method proceeds further by measuring a first characteristic such as A1–B1 between patterned surface layer 84 and the embedded feature 74. Next, a second characteristic such as A2–B2 is measured between patterned surface layer 84 and an exposed recess 92 in the substrate 70. Moreover, a third characteristic such as A3–B3 can be obtained in a direct measurement.

Figure 8A:
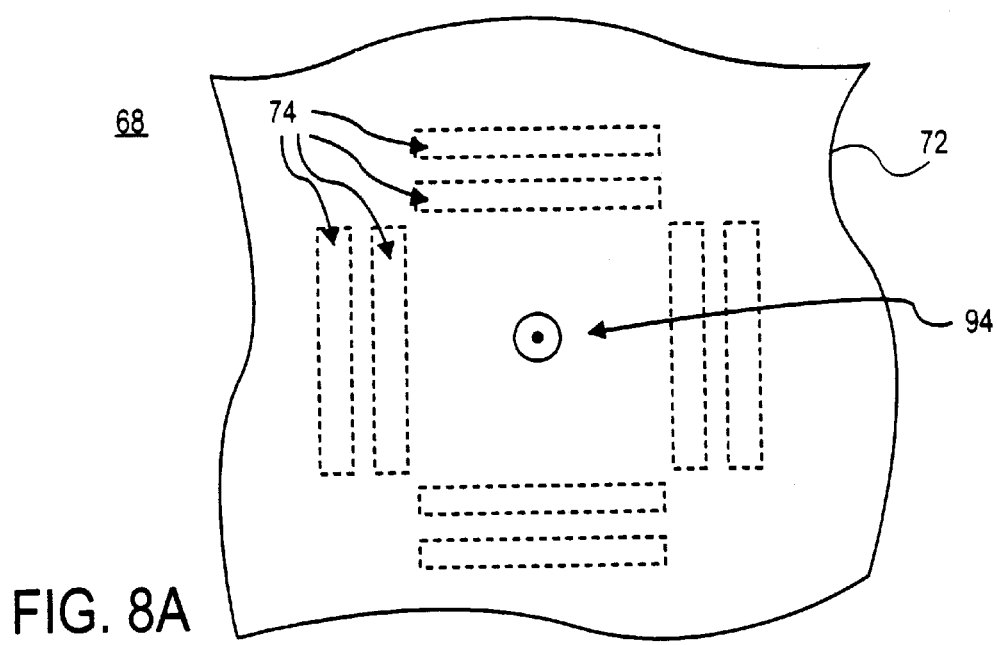
Figure 8B:
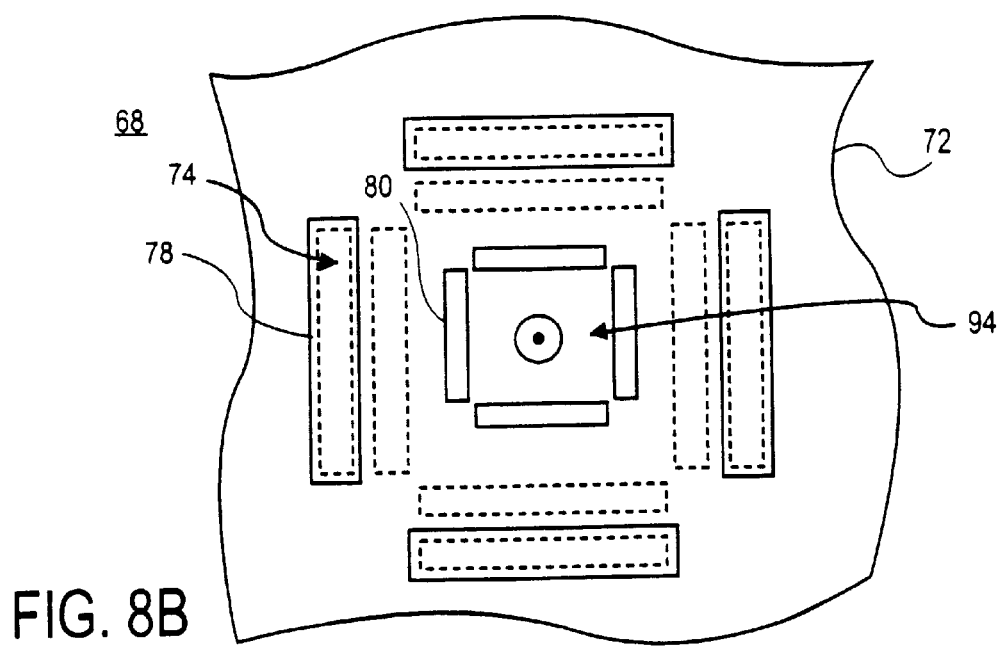
FIG. 8b is a plan view of the structure depicted in FIG. 7b.
Figure 8C:
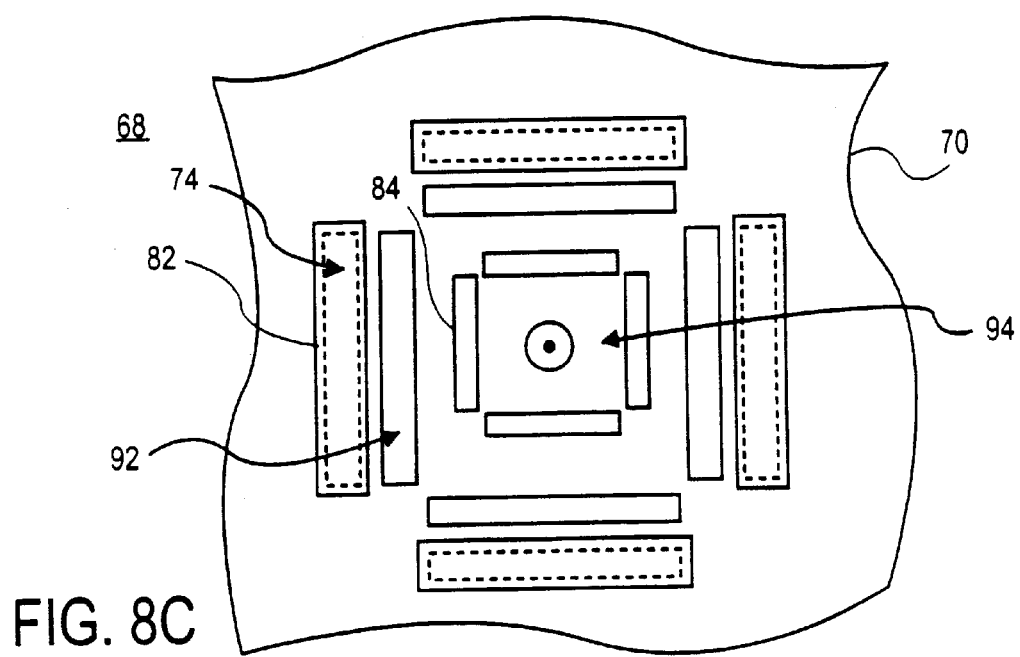
FIG. 8c is a plan view of the structure depicted in FIG. 7c.

According to the method, patterned overcoating layer 82 comprises an outer target, and patterned surface layer 84 comprises an inner target. Accordingly, the outer target and the inner target are disposed within a single visual field that has a point of rectilinear symmetry such as symmetry line 90. When observed in plan view, in FIGS. 8a–8c, overlay 68 illustrates embedded features as recesses 74 in FIG. 8a. In FIG. 8b, overlay 68 illustrates embedded features as recesses 74, and prominent features as mask outer pattern 78 and as mask inner pattern 80 disposed upon overcoating layer 72. In FIG. 8c, overlay 68 illustrates embedded features as recesses 74, prominent features as patterned overcoating layer 82 and patterned surface layer 84, and recessed features as recess 92. In FIG. 8, a rectilinear symmetry point 94 may be understood to be intersected by symmetry line 90.

The overlay depicted in FIGS. 3 and 4 was used to obtain various data. Measurements on the Target A are repeated under various measurement conditions. Overlay measurements were collected in both 0 and 180 degree orientations. The TIS-corrected measurements were found to be consistent regardless of illumination and focus settings.

Figure 9:
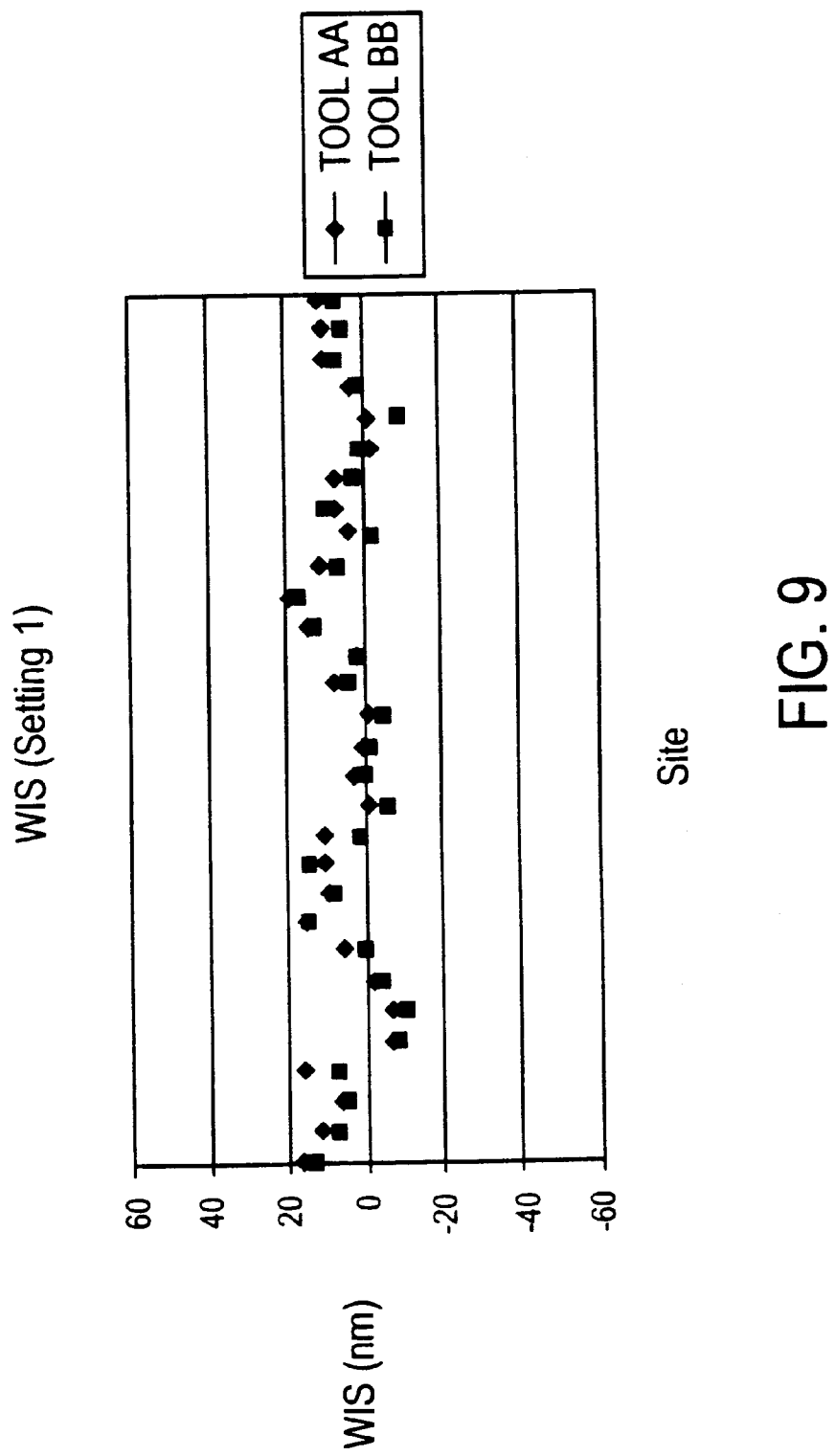
FIG. 9 is a graphic of WIS testing.
Figure 10:
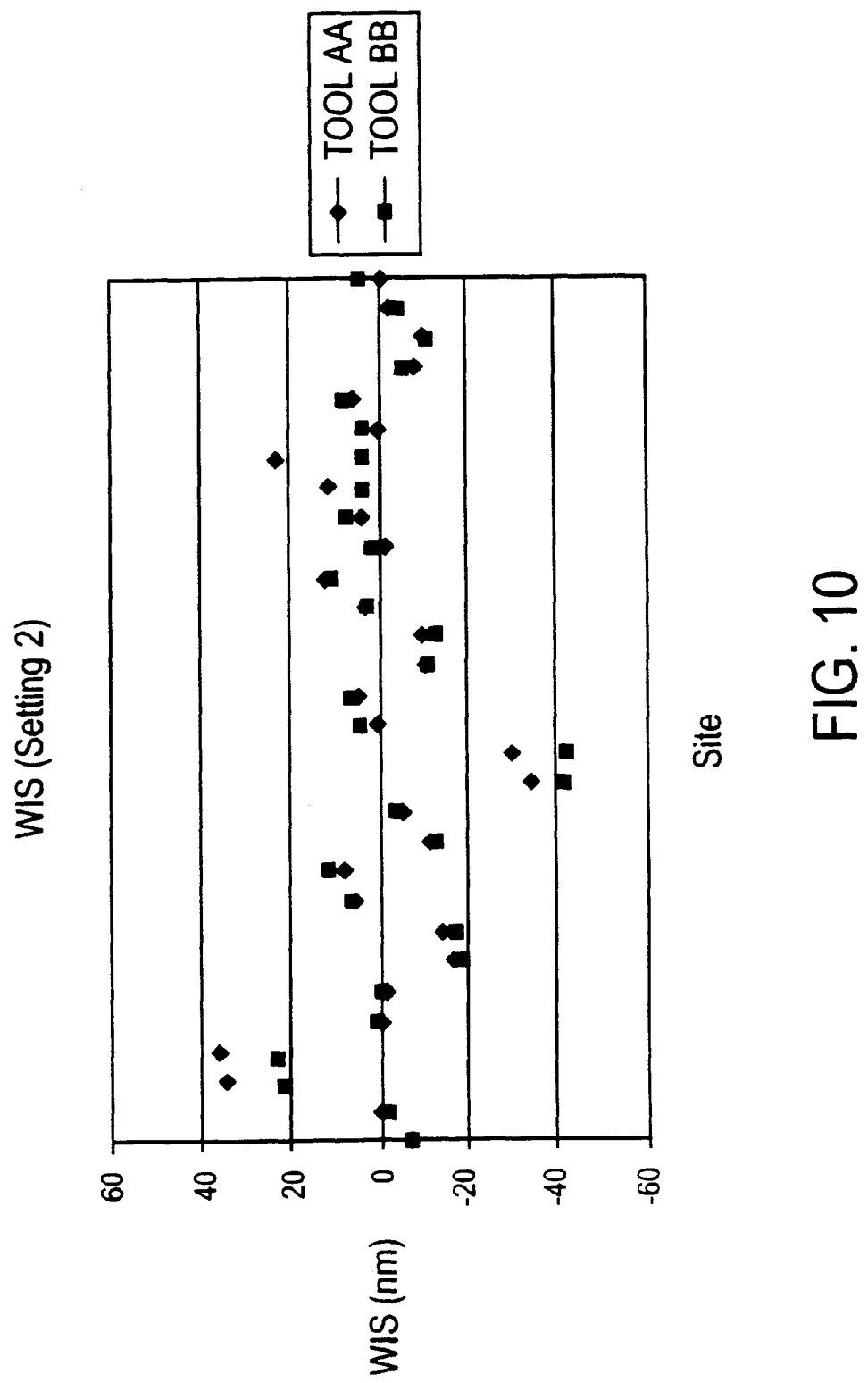
FIG. 10 is a graphic of WIS testing.

Measurements on Target B were performed in a few measurement conditions, with different illumination and focus settings. In Setting 1, measurements on Target B tracked closely with measurements on Target A; the WIS is a small number. However, using Setting 2, this close tracking of measurements was not exhibited on certain locations. Consequently, Setting 1 was used in DC measurements as the DC measurements result is a close representation of the overlay results in FC. The results of these tests are illustrated in FIGS. 9 and 10.

Figure 11:
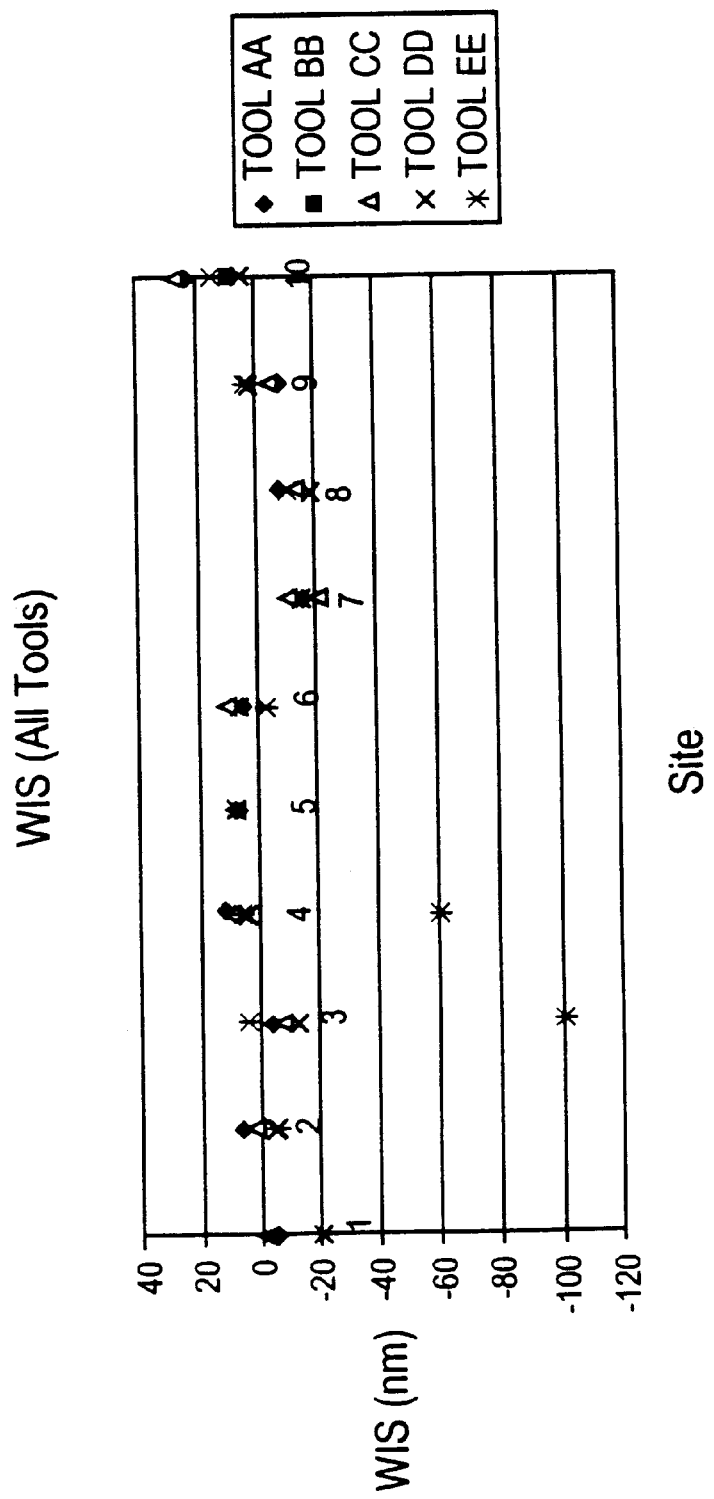
FIG. 11 is a graphic of both WIS and TIS testing.

In a second case, Target A and Target B were measured on five overlay tools and then compared to the respective WIS. The WIS was found to be within the uncertainty of the overlay tool specification except Tool EE. Tool EE exhibited a larger than expected WIS on location 3 and 4. After review of the image from these locations on tool EE, it was found that the image was off focus. Tool EE had difficulties in measuring Target B in the proper focal position. This result agrees with the record of Tool EE being a less consistent tool compared to the rest of the population. The results of these tests are illustrated in FIG. 11.

FIG. 12 illustrates a flow diagram of the inventive method of quantifying wafer-induced shift 100. The method may begin at block 110 by providing a wafer. The wafer comprises a first overlay pattern disposed upon a substrate as set forth above. Further, the wafer comprises a second overlay pattern disposed upon the substrate. The second overlay pattern has a reversed polarity to the first overlay pattern. According to processing in block 120, the method continues by measuring differences on each of the first overlay pattern and the second overlay pattern.

Figure 13:
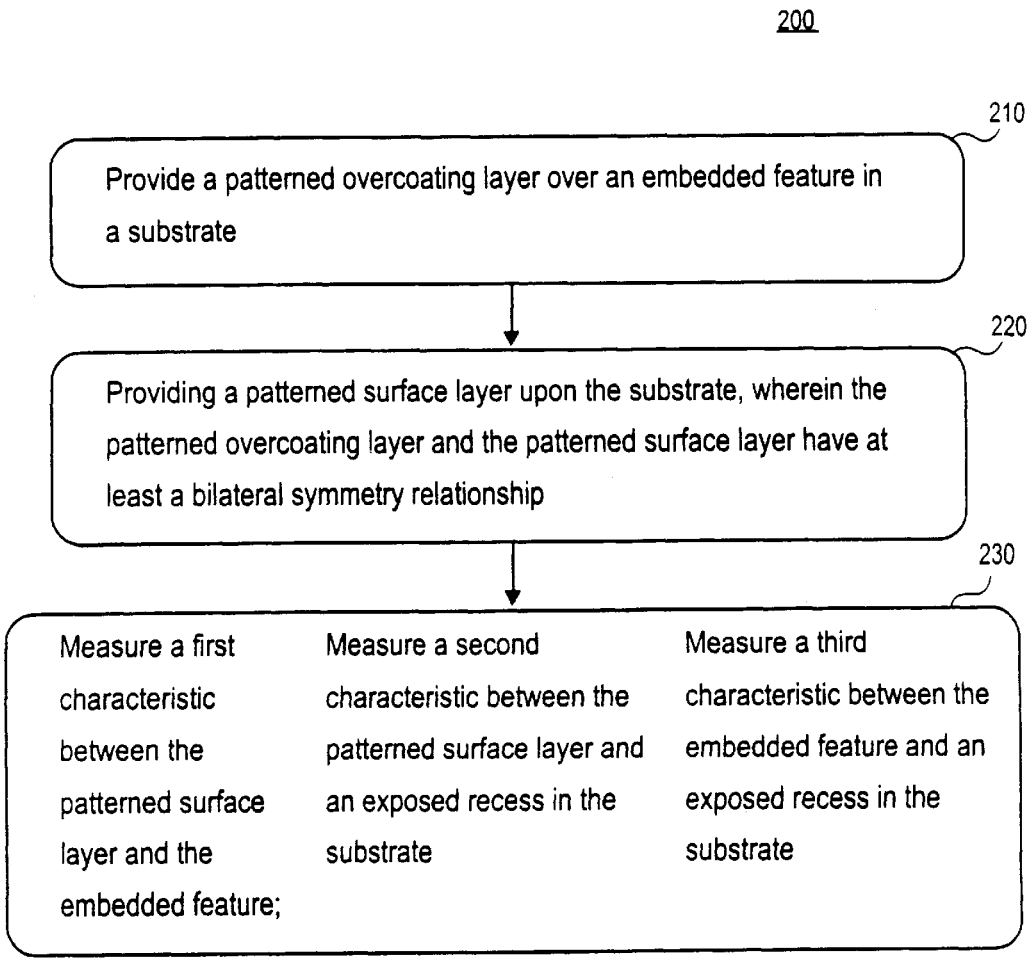
FIG. 13 is a flow chart that describes an inventive method according to the present invention.

FIG. 13 illustrates a flow diagram of another embodiment 200 of the present invention. In this embodiment, a method of characterizing a device is provided. The method comprises providing a patterned overcoating layer over an embedded feature in a substrate as illustrated in process flow block 210. Next, a patterned surface layer is provided upon the substrate as illustrated in process flow block 220. The patterned overcoating layer and the patterned surface layer have at least a bilateral symmetry relationship as set forth above. Next, a first characteristic is measured between the patterned surface layer and the embedded feature as depicted in process flow block 230. Additionally, a second characteristic is measured between the patterned surface layer and an exposed recess in the substrate as depicted in process flow block 230. Finally, a third characteristic is measured between the embedded feature and an exposed recess in the substrate as depicted in process flow block 230. It is notable that any of the latter three processes may be carried out in an order independent of the remaining two.

In summary, with an artifact wafer in FC such as depicted in FIGS. 3 and 4, the present invention uses Target B to optimize the measurement algorithm until the measurement is closest to that of Target A. Experiments showed that measurement Setting #1 has a smaller variablilty in WIS than Setting #2. This provides a metric to evaluate various measurement algorithms.

In the second case, the artifact wafer can be used as a tool to identify problematic overlay tools within the population. Under the same measurement conditions, the WIS should be consistent within the uncertainty of the overlay tool. A higher than average WIS may point to a problematic illumination or focus module.

In addition, these target designs can be readily inserted into product wafers. Any product wafers in post etch can be used as an artifact wafer. Evaluation on measurement algorithm or overlay tools can be performed with the latest process change incorporated on the artifact wafer.

According to the present invention, wafer-induced shift (WIS) may be quantified without exposing the wafer to an etch that, if registration reveals improper alignment, results in the necessity of discarding the wafer. Accordingly, WIS is quantified by providing a wafer according to the present invention. The wafer may comprise a first overlay pattern disposed upon a substrate and a second overlay pattern disposed upon the substrate. According to the present invention, the second overlay pattern has a reversed polarity to the first overlay pattern. The method of quantifying WIS is carried out by measuring differences on each of the first overlay pattern and the second overlay pattern. Thus, A2–B2 and A1–B1 may be correlated after a manner to give a characteristic delta for a given wafer.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. An overlay comprising:
   a first overlay pattern disposed upon a substrate; and
   a second overlay pattern disposed upon the substrate, wherein the second overlay pattern has a reverse polarity to the first overlay pattern, each of the first overlay pattern and the second overlay pattern formed within a multilayer structure having a recessed layer and a overcoating layer formed upon the recessed layer.

2. The overlay according to claim 1, wherein the first overlay pattern comprises prominent inner bars and embedded outer bars.

3. The overlay according to claim 1, wherein the second overlay pattern comprises recessed inner bars and embedded outer bars.

4. The overlay according to claim 1, wherein the first overlay pattern comprises prominent inner bars and recessed outer bars.

5. The overlay according to claim 1, wherein the second overlay pattern comprises recessed inner bars and embedded outer bars.

6. The overlay according to claim 1, wherein the first overlay pattern comprises a prominent inner rectangle and an embedded outer rectangle.

7. The overlay according to claim 1, wherein the second overlay pattern comprises a recessed inner rectangle and an embedded outer rectangle.

8. The overlay according to claim 1, wherein the first overlay pattern comprises a prominent inner rectangle and a recessed outer rectangle.

9. The overlay according to claim 1, wherein the second overlay pattern comprises a recessed inner rectangle and an embedded outer rectangle.

10. An overlay comprising:
    a first overlay pattern disposed upon a substrate; and
    a second overlay pattern disposed upon the substrate, wherein the first overlay pattern is disposed over an embedded feature in the substrate, and wherein the second overlay pattern is disposed symmetrically to the first overlay pattern, each of the first overlay pattern and the second overlay pattern formed within a multilayer structure having a recessed layer and a overcoating layer formed upon the recessed layer.

11. A device comprising:
    a substrate;
    a recessed layer formed upon the substrate;
    a plurality of overlay patterns disposed upon the recessed layer, at least one of the overlay patterns having a polarity complimentary to at least one other overlay pattern.

12. The device of claim 11 wherein the recessed layer is an interlayer dielectric.

13. The device of claim 11 wherein the plurality of overlay patterns is formed within a polysilicon layer.

14. The device of claim 11 wherein the plurality of overlay patterns is formed within a metallization layer.

* * * * *